United States Patent
Xue et al.

(10) Patent No.: US 9,498,801 B2
(45) Date of Patent: Nov. 22, 2016

(54) COATING REMOVING DEVICE AND COATING REMOVING METHOD

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Guang-Hui Xue, Shenzhen (CN); Yan-Zheng Liang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 540 days.

(21) Appl. No.: 13/714,315

(22) Filed: Dec. 13, 2012

(65) Prior Publication Data

US 2013/0160792 A1 Jun. 27, 2013

(51) Int. Cl.
```
B23K 26/08   (2014.01)
B23K 26/40   (2014.01)
H05K 3/00    (2006.01)
B08B 7/00    (2006.01)
```

(52) U.S. Cl.
CPC .......... B08B 7/0042 (2013.01); B23K 26/08 (2013.01); B23K 26/40 (2013.01); H05K 3/0008 (2013.01); *B23K 2201/35* (2015.10)

(58) Field of Classification Search
CPC .......... H05K 2203/107; H05K 3/068; B23K 26/02; B23K 26/0869; B23K 26/4095
See application file for complete search history.

(56) References Cited

U.S. PATENT DOCUMENTS

| | | | |
|---|---|---|---|
| 5,561,962 A * | 10/1996 | Everhard | B65B 25/002 53/381.6 |
| 2004/0118824 A1* | 6/2004 | Burgess | B23K 26/0626 219/121.71 |
| 2007/0084837 A1* | 4/2007 | Kosmowski | 219/121.68 |

FOREIGN PATENT DOCUMENTS

| | | | |
|---|---|---|---|
| CN | 102164461 A | * | 8/2011 |
| TW | 200730285 A | | 8/2007 |

OTHER PUBLICATIONS

Machine translation: CN102164461A; Gao et al., Aug. 24, 2011.*

* cited by examiner

*Primary Examiner* — Michael Kornakov
*Assistant Examiner* — Natasha Campbell
(74) *Attorney, Agent, or Firm* — Zhigang Ma

(57) ABSTRACT

A coating removing device includes a coating thickness gauge configured for detecting a thickness of a coating layer formed on a surface of a article. A controller configured for determining an intensity of a laser beam needed to be emitted according to the thickness of the coating layer detected by the coating thickness gauge. In addition, a laser emitter emits the laser beam to the coating layer to remove the coating layer, the laser beam having the intensity determined according to the thickness of the coating layer. The intensity and energy of the laser beam arrived the surface of the article is changed over the coating thickness on the surface, the coated adhesive layer of the PCB is removed, and the appearance of the PCB will not be damaged.

6 Claims, 2 Drawing Sheets

COATING REMOVING DEVICE AND COATING REMOVING METHOD

BACKGROUND

1. Technical Field

The present disclosure relates to coating removing devices and coating removing methods, particularly to a coating removing device and a coating removing method employing laser technique.

2. Description of Related Art

A coating removing step is usually required during a Printed Circuit Board (PCB) troubleshooting process. Mechanical degumming process is a typical method to remove an adhesive coating on the PCB. The process is carried out by scratching the adhesive layer via a blade. In the above conventional method, the PCBs tend to be damaged and the appearance of the PCB cannot be restored. Therefore, there is room for improvement in the art

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
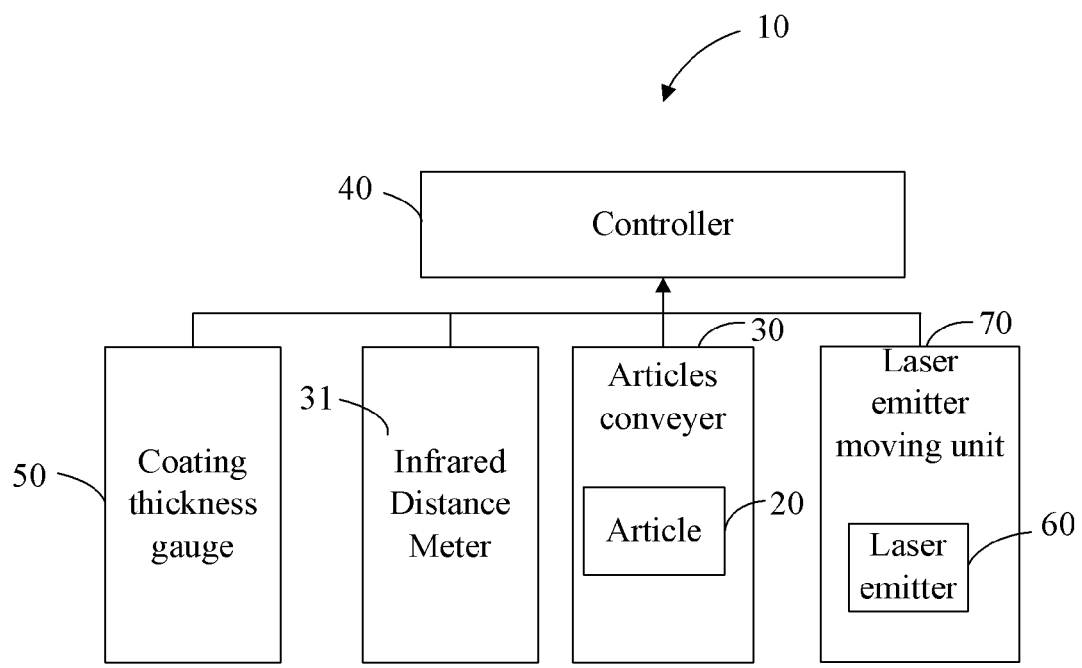
FIG. 1 is a block diagram illustrating a coating removing device, according to an exemplary embodiment.

FIG. 1 shows a coating removing device 10 of the embodiment. The coating removing device 10 is used to remove a coating layer on an article 20. The article 20 can be a Printed Circuit Board (PCB), a housing of an electronic device, a plastic, glass or metallic substrate, for example. The coating layer can be an adhesive layer, a glue layer, an ink layer or gum layer, for example. In this embodiment, an example of a PCB having an adhesive coating is illustrated. The coating removing device 10 includes an articles conveyer 30, a controller 40, a coating thickness gauge 50, a laser emitter 60 and a laser emitter moving unit 70.

The articles conveyer 30 is used for transporting the article 20 to a preset position where the article directly faces the coating thickness gauge 50. The articles conveyer 30 is a conveying belt in the embodiment. The coating removing device 10 further includes an Infrared Distance Meter 31 for detecting whether the article 20 has been conveyed to the preset position, and sending a signal to the controller 40 when the article 20 has been conveyed to the preset position. The controller 40 sends a stop command to the articles conveyer 30 to pause the motion of the articles conveyer 30 in response to the signal sent by the Infrared Distance Meter 31.

The coating thickness gauge 50 is used to detect the thickness of the coating layer on the surface of the article 20, and send the detected result to the controller 40. The laser emitter moving unit 70 can be a transporting arm, a robot arm or a rail transport, for example. The laser emitter moving unit 70 is capable of moving toward the plane parallel to the article 20 or a transporting plane of the articles conveyer 30. The coating thickness gauge 50 is fixed on the laser emitter moving unit 70, and capable of detecting the thickness of the whole of the coating layer on the article 20. In this embodiment, the coating thickness gauge 50 is a thickness gauge based on infrared detecting technique. The coating thickness gauge 50 is movable jointly with the laser emitter moving unit 70 along a preset moving path, and a point-by-point scanning process is employed to detect the thickness of the coating layer on the surface of the article 20, and the coating thickness gauge 50 sends thickness of the coating layers on each detected point to the controller 40. The coating thickness gauge 50 is moved with the laser emitter moving unit 70 in a preset moving path.

The laser emitter 60 emits and directs laser beam to the surface of the article 20. In this embodiment, the laser beam is directed perpendicular to the surface of the article 20. The intensity of the laser beam emitted from the laser emitter 60 is modulated, where the characteristic parameters of the intensity, like the duration, frequency and the interval of the laser beam are modulated.

The laser emitter 60 is also fixed on the laser emitter moving unit 70 spaced apart a distance from the coating thickness gauge 50. The laser emitter 60 is configured to move along the preset moving path so as to enable a light spot formed by the laser beam on the surface of the article 20 to coincide with a detecting point of the coating thickness gauge 50 on the surface of the article 20. The controller 40 determines the intensity of laser beam to be emitted according to the thickness of the coating layer detected by the coating thickness gauge 50. The laser emitter 60 emits a laser beam with a corresponding intensity to the surface of the article 20. The coating is vaporized under etching of the laser beam.

Since the intensity and energy of the laser beam reaching the surface of the article 20 is changed over the coating thickness on the surface thereof, the coated adhesive layer of the PCB is removed, and the appearance of the PCB will not be damaged.

Figure 2:
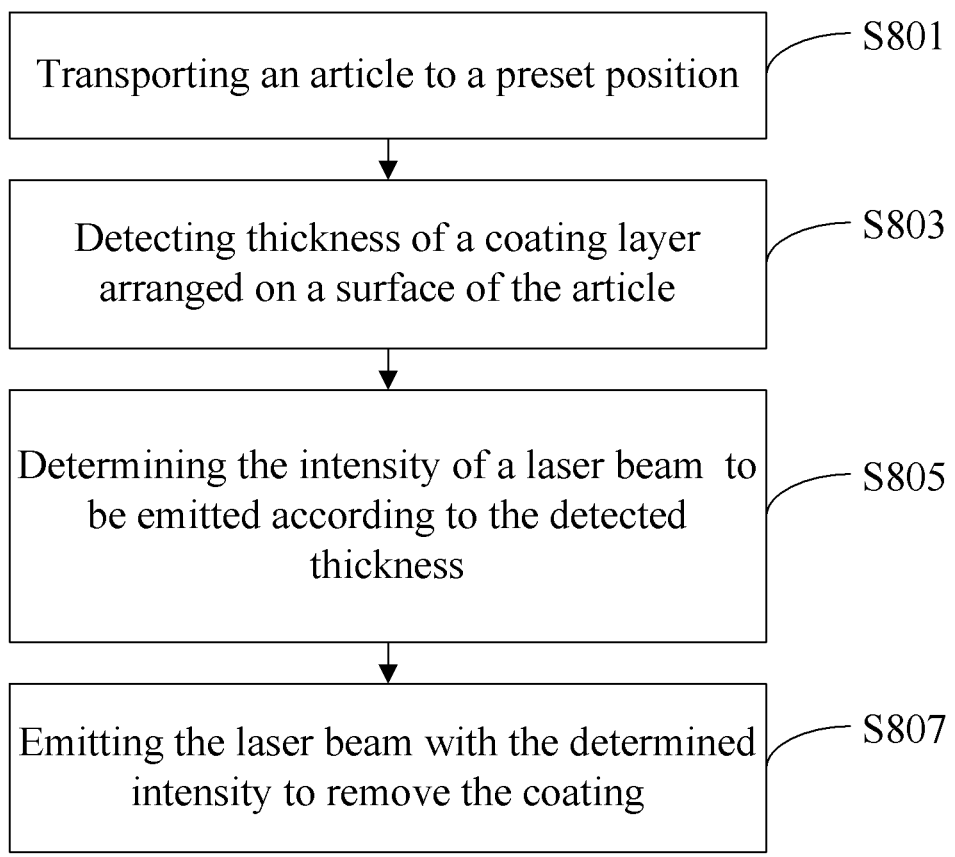
FIG. 2 is a flowchart of a coating removing process according to an exemplary embodiment.

FIG. 2 shows a flowchart of a coating removing method implemented by the coating removing device 10. The method includes the following steps, each of which is tied to various components contained in the coating removing device 10 as shown in FIG. 1.

In step S801, the articles conveyer 30 transports the article 20 to a preset position directly facing the coating thickness gauge 50.

In step S803, the coating thickness gauge 50 detects the thickness of the coating layer on the surface of the article. The coating thickness gauge 50 moves with the laser emitter moving unit 70 in a preset moving path and detects the thickness of the coating layer on the surface of the article 20.

In step S805, the controller 40 determines the intensity of laser beam to be emitted according to the detected thickness of the coating layer detected by the coating thickness gauge 50.

In step S807, the laser emitter 60 emits a laser beam with the determined intensity to remove the coating from the surface of the article 20.

Although the present disclosure has been specifically described on the basis of the embodiments thereof, the disclosure is not to be construed as being limited thereto.

Various changes or modifications may be made to the embodiments without departing from the scope and spirit of the disclosure.

What is claimed is:

1. A coating removing device comprising:
a conveyer for transporting an article to a preset position;
an infrared distance meter for detecting whether the article has been conveyed to the preset position;
a coating thickness gauge configured to detect thickness of a coating layer formed on each point of a surface of the article in response to the conveyance of the article to the preset position, wherein the coating thickness gauge employs a point-by-point scanning process to detect thickness of each point of the coating layer on the surface of the article;
a controller configured to determine an intensity of a laser beam output of the device according to the thickness of the coating layer at a point detected by the coating thickness gauge; and
a laser emitter configured to emit the laser beam toward the coating layer coinciding with the detected point of the coating thickness gauge to remove the coating layer, wherein a intensity of the emitted laser beam is determined according to the thickness of the coating layer of the detected point.

2. The coating removing device as described in claim 1, further comprising a laser emitter moving unit configured for moving the laser emitter to direct the laser beam to the surface of the article.

3. The coating removing device as described in claim 2, wherein the coating thickness gauge is fixed on the laser emitter moving unit, the coating thickness gauge is movable jointly with the laser emitter moving unit along a preset moving path, and the laser emitter is configured to move along the preset moving path.

4. The coating removing device as described in claim 1, wherein the article is a printed circuit board.

5. The coating removing device as described in claim 1, wherein the coating layer is an adhesive layer.

6. A coating removing method comprising:
transporting an article to a preset position;
detecting whether the article has been conveyed to the preset position;
detecting a thickness of a coating layer on each point of a surface of the article in response to the conveyance of the article to the preset position, wherein the coating thickness gauge employs a point-by-point scanning process to detect thickness of each point of the coating layer on the surface of the article;
determining an intensity of a laser beam to be emitted according to the detected thickness of the coating layer at a detected point; and
emitting the laser beam toward the coating layer at a location coinciding with the detected point with the determined intensity to remove the coating from the surface of the article.

* * * * *